(12) United States Patent
Hatanaka et al.

(10) Patent No.: US 9,165,849 B2
(45) Date of Patent: Oct. 20, 2015

(54) ELECTRONIC DEVICE

(75) Inventors: Hidefumi Hatanaka, Kirishima (JP); Katsura Hayashi, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 275 days.

(21) Appl. No.: 13/820,080

(22) PCT Filed: Oct. 25, 2011

(86) PCT No.: PCT/JP2011/074549
§ 371 (c)(1),
(2), (4) Date: Jun. 12, 2013

(87) PCT Pub. No.: WO2012/057137
PCT Pub. Date: May 3, 2012

(65) Prior Publication Data
US 2013/0250527 A1 Sep. 26, 2013

(30) Foreign Application Priority Data
Oct. 28, 2010 (JP) .................. 2010-242104

(51) Int. Cl.
*H05K 1/18* (2006.01)
*H01L 23/29* (2006.01)
(Continued)

(52) U.S. Cl.
CPC .............. *H01L 23/29* (2013.01); *H01L 23/295* (2013.01); *H01L 23/3135* (2013.01);
(Continued)

(58) Field of Classification Search
CPC .......... H01L 2224/16225; H01L 2224/16227; H01L 23/29; H01L 23/295; H01L 23/3135; H01L 2924/01019; H01L 2924/09701; H03H 9/1007; H03H 9/1078; H03H 9/1085; H05K 1/181

USPC .................. 361/760, 764, 783, 816
See application file for complete search history.

(56) References Cited

U.S. PATENT DOCUMENTS 6,492,194 B1 * 12/2002 Bureau et al. ................. 438/106
2001/0009277 A1 * 7/2001 Gaynes et al. .................... 257/1
(Continued)

FOREIGN PATENT DOCUMENTS

| CN | 1802049 A | 7/2006 |
|---|---|---|
| JP | H07-111438 A | 4/1995 |

(Continued)

OTHER PUBLICATIONS

Office action dated Apr. 29, 2014 issued for Korean counterpart application No. 2013-7005185.
(Continued)

*Primary Examiner* — Yuriy Semenenko
(74) *Attorney, Agent, or Firm* — Procopio, Cory, Hargreaves & Savitch LLP

(57) ABSTRACT

An electronic device is provided wherein the characteristics thereof are prevented from deteriorating. The electronic device (1) is provided with: a chip component (2) having an electronic element (22); a wiring board (3) on which the chip component (2) is mounted with a space therebetween, the space for containing the electronic element (22); a resin layer (4) provided from the surface of the chip component (2) to the surface of the wiring board (3) so as to surround the space; and an inorganic insulating layer (5), which is provided at the resin layer (4) and is positioned at the side of the space. Since entry of water vapor into the space can be reduced not only by means of the resin layer (4) but also by means of the inorganic insulating layer (5), the electronic device (1) having high airtight sealing performance can be provided.

12 Claims, 11 Drawing Sheets

(51) Int. Cl.
*H01L 23/31* (2006.01)
*H03H 9/10* (2006.01)

(52) U.S. Cl.
CPC .......... *H03H 9/1007* (2013.01); *H03H 9/1078* (2013.01); *H03H 9/1085* (2013.01); *H05K 1/181* (2013.01); *H01L 2224/16225* (2013.01); *H01L 2224/16227* (2013.01); *H01L 2924/01019* (2013.01); *H01L 2924/09701* (2013.01)

(56) References Cited

U.S. PATENT DOCUMENTS

2004/0237299 A1* 12/2004 Stelzl et al. .................. 29/855
2005/0121785 A1* 6/2005 Stelzl et al. .................. 257/738
2012/0205754 A1* 8/2012 Iwamoto ..................... 257/415

FOREIGN PATENT DOCUMENTS

| JP | 2004-537178 | A | 12/2004 |
| JP | 2005-514847 | A | 5/2005 |
| JP | 2010-189600 | A | 9/2010 |
| JP | WO2011052551 | * | 5/2011 |

OTHER PUBLICATIONS

Office action dated Dec. 22, 2014, issued for Chinese counterpart application No. 201180041720.7.

International Search Report dated Nov. 22, 2011, issued for International Application No. PCT/JP2011/074549.

* cited by examiner

ELECTRONIC DEVICE

TECHNICAL FIELD

The present invention relates to an electronic device.

BACKGROUND ART

In a conventional electronic device, a chip component having an electronic element has been mounted on a wiring board with a space therebetween. The space contains the electronic element. Further, in order to completely seal this space, a resin layer has been provided from the surface of the chip component to the surface of the wiring board so as to surround the sides of this space.

CITATIONS LIST

Patent Literature

Patent Literature 1: Japanese Patent Publication No. 7-111438 A1

SUMMARY OF INVENTION

Technical Problem

However, in joint members of a conventional electronic device, the resin material configuring the resin layer surrounding the sides sometimes invaded the space. In such a case, the resin material ended up adhering to the electronic element etc., therefore there was the problem that the characteristics were apt to end up deteriorating.

The present invention was made in consideration with the issue described above and has as an object thereof to provide an electronic device capable of preventing deterioration of the characteristics.

Solution to Problem

An electronic device of the present invention includes a chip component having an electronic element; a wiring board on which the chip component is mounted with a space therebetween, the space for containing the electronic element; a resin layer provided from the surface of the chip component to the surface of the wiring board so as to surround the space; and an inorganic insulating layer which is provided at the resin layer and is positioned at the side of the space.

Advantageous Effects of Invention

According to the electronic device of the present invention, because of provision of the chip component having the electronic element, the wiring board on which the chip component is mounted with the space for containing the electronic element, the resin layer provided from the surface of the chip component to the surface of the resin layer so as to surround the space, and the inorganic insulating layer which is provided at the resin layer and is positioned at the sides of the space, invasion of water vapor into the space can be reduced not only by means of the resin layer 4, but also by means of the inorganic insulating layer 5, therefore an electronic device 1 having a high airtight sealing performance can be provided.

DESCRIPTION OF EMBODIMENTS

An example of an embodiment of an electronic device of the present invention will be explained in detail below with reference to the drawings.

(First Embodiment)

Figure 1A:
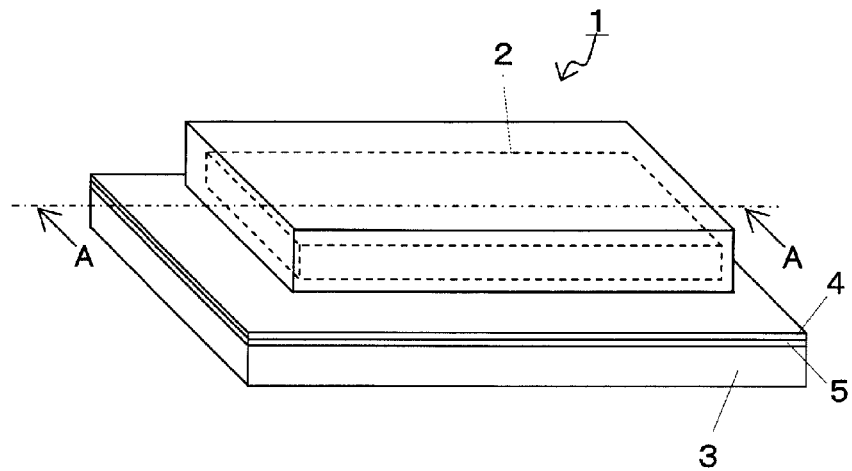
[FIG. 1] A is a perspective view showing an example of an embodiment of an electronic device of the present invention, and B is a cross-sectional view along an AA line in A.
Figure 1B:
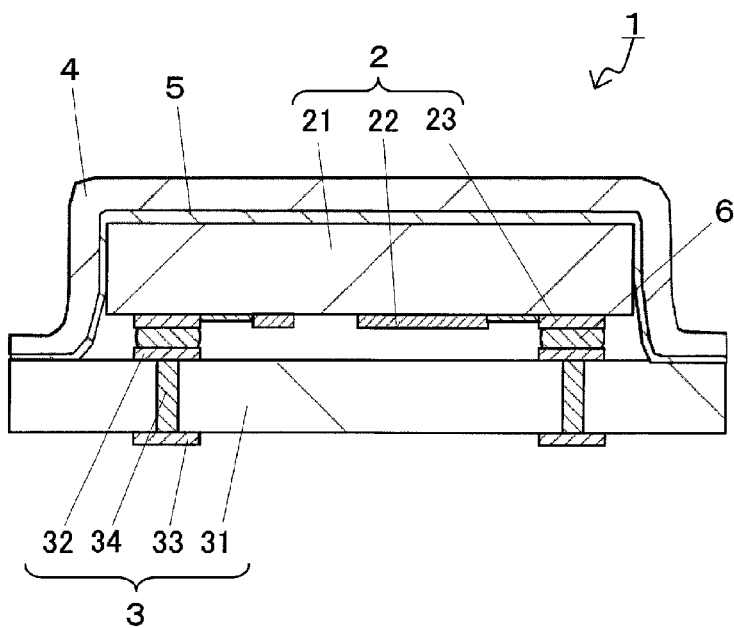

An electronic device 1 shown in FIG. 1 is provided with a chip component 2, wiring board 3, resin layer 4, and inorganic insulating layer 5. The chip component 2 has an electronic element 22. The chip component 2 is mounted on the wiring board 3 with a space therebetween. The space contains the electronic element 22. The resin layer 4 is provided from the surface of the chip component 2 to the surface of the wiring board 3 so as to surround the space. The inorganic insulating layer 5 is provided at the resin layer 4 and is positioned at the sides of the space.

According to this configuration, invasion of water vapor into the space can be reduced not only by means of the resin layer 4, but also by means of the inorganic insulating layer 5, therefore an electronic device 1 having a high airtight sealing performance can be provided.

In the example shown in FIG. 1, a surface acoustic wave device is shown as the electronic device 1.

Figure 2:
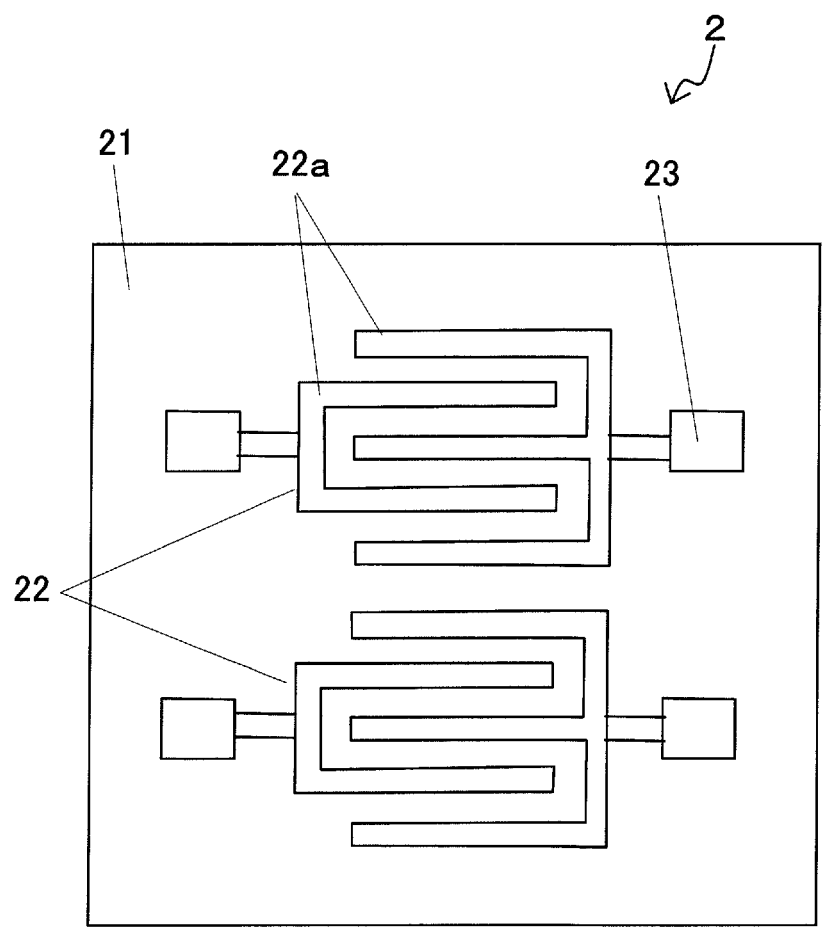
[FIG. 2] A plan view of a chip component of the electronic device shown in FIG. 1.

In the example shown in FIG. 1 and FIG. 2, a surface acoustic wave element is shown as the chip component 2. Further, as the electronic element 22, an IDT (interdigital transducer) electrodes 22 is shown. This surface acoustic wave element has a piezoelectric substrate 21 and has IDT electrodes 22 and pad electrodes 23 which are provided on one surface (hereinafter, this surface will be defined as the "front surface", and the other surface will be defined as the "back surface").

The piezoelectric substrate 21 is a rectangular parallelepiped shaped single crystal substrate having a piezoelectric property such as $LiTaO_3$ or $LiNbO_3$. The shape of the major surface of the piezoelectric substrate 21 may be suitably set, but is for example rectangular. The size of the piezoelectric substrate 21 may be suitably set, but for example the thickness is 0.2 mm to 0.5 mm, and the length of one side is 0.5 mm to 2 mm.

In the example shown in FIG. 2, two IDT electrodes 22 are arranged side by side in the vicinity of the center on the front surface of the piezoelectric substrate 21. Each IDT electrode 22 is configured by two electrodes 22a formed in a comb-shaped state (hereinafter, referred to as comb-shaped electrodes 22a). The comb-shaped electrodes 22a are arranged so as to face each other and so that their electrode fingers mesh with each other.

The pad electrodes 23 are electrodes for supplying power to the IDT electrodes 22. The pad electrodes 23 are scattered at the peripheral sides of the front surface of the piezoelectric substrate 21.

All of these IDT electrodes 22 and pad electrodes 23 can be formed by metal films made of Al or an Al alloy (for example Al—Cu based or Al—Ti based), Cu or a Cu alloy (for example Cu—Mg based, Cu—Ti based, or Cu-Rd based), Ag or an Ag alloy (for example, Ag—Mg based, Ag—Ti based, or Ag-Rd based), or the like.

Further, though not illustrated, on the exposed surface of the IDT electrodes 22, a protective film formed by material having a high insulation property such as Si, $SiO_2$, $SiN_x$, $Al_2O_3$, or the like may be provided. Due to this, short-circuiting due to conductive foreign matter sticking between electrode fingers of the IDT electrodes 22 can be prevented.

On the pad electrodes 23, bumps 6 are provided. These bumps 6 are formed according to the wire bump method used at the time of face down connection of a semiconductor integrated circuit by Au or Al wires. Further, the bumps 6 may be formed by the solder bump method as well.

In the example shown in FIG. 1, the wiring board 3 has a substrate body 31 and pad electrodes 32 and 33 provided on this substrate body 31.

For the substrate body 31, use is made of a ceramic material such as an aluminum oxide sintered body, aluminum nitride sintered body, mullite sintered body, silicon carbide sintered body, glass ceramic sintered body, or the like. Further, use may be made of an organic resin material such as a polyimide resin, epoxy resin, or the like. Further, use may be made of a composite material formed by mixing an inorganic material such as a ceramic, glass or the like with an organic resin material such as an epoxy resin or the like.

Specifically, when the substrate body 31 is formed by for example an aluminum oxide sintered body, it is formed by shaping aluminum oxide and raw material powder such as glass powder or the like into sheets, stacking the formed green sheets, and sintering the assembly. Note that, the substrate body 31 is not limited to one formed by an aluminum oxide sintered body. Preferably, a suitable one is selected in accordance with the application and the characteristics of the electronic element 22 to be hermetically sealed and so on.

For example, the substrate body 31 is electrically and/or mechanically joined to the chip component 2 with the bumps 6 therebetween. Therefore, in order to raise the reliability of the joint with the chip component 2, that is, the air-tightness of sealing of the electronic elements 22, preferably the substrate body 31 is formed by a mullite sintered body, or a material in which the thermal expansion coefficient is made approximately that of the piezoelectric substrate 21 of the chip component 2 by adjusting for example the type or amount of addition of the glass ingredient. As an example of such a material, there can be mentioned a glass ceramic sintered body such as an aluminum oxide-borosilicate glass based and so on.

Further, when trying to prevent delay of electrical signals transmitted by the pad electrodes 32 and 33, preferably the substrate body 31 is formed by a material having a small dielectric constant such as an organic resin material such as a polyimide/glass epoxy resin or the like, a composite material formed by bonding inorganic powder such as ceramic, glass or the like by organic resin such as epoxy resin or the like, a glass ceramic sintered body such as an aluminum oxide-borosilicate glass based, lithium oxide based or the like.

In the example shown in FIG. 1, on one surface of this wiring board 3 (hereinafter, this surface will be defined as the "front surface", and the other surface will be defined as the "back surface"), the substrate side pad electrodes 32 are provided at positions corresponding to the pad electrodes 23 of the chip component 2.

Further, on the back surface of the wiring board 3 as well, pad electrodes 33 are provided.

Inside the wiring board 3, via conductors 34 are provided which connect the pad electrodes 32 on the front surface of the wiring board 3 and the pad electrodes 33 on the back surface of the wiring board 3.

These pad electrodes 32 and 33 and via conductors 34 are formed by W, Ta, or the like. The pad electrodes 32 on the front surface side, in order to raise the bondability with the corresponding bumps 6, are preferably plated by Ni and further are plated by Au.

The electrical connection between the wiring board 3 and the chip component 2 is made through the bumps 6. The bumps 6 of the chip component 2 and the pad electrodes 32 of the wiring board 3 are connected by thermo-compression bonding method or thermo-sonic bonding method.

In the example shown in FIG. 1, the resin layer 4 is provided on the inorganic insulating layer 5 from the surface of the chip component 2 to the surface of the wiring board 3 so as to surround the space. For the resin layer 4, for example use is made of a thermosetting resin such as a phenol based resin, polyimide based resin, epoxy based resin, or the like.

In the example shown in FIG. 1, the inorganic insulating layer 5 is provided from the surface of the chip component 2 to the surface of the wiring board 3 so as to surround the space. Further, in this example, the inorganic insulating layer 5 is provided at the inner surface of the resin layer 4.

As will be explained later, in order to provide the inorganic insulating layer 5 and resin layer 4, first, a sheet-shaped resin layer 4 is provided with an inorganic insulating layer 5, then they are placed on the chip component 2 so that the inorganic insulating layer 5 side is positioned on the chip component 2 side. Next, heat is applied to the resin layer 4 to soften the resin layer 4. These layers are deformed so as to become shapes matching the surface of the chip component 2.

Here, so far as the inorganic insulating layer 5 is provided at the inner surface of the resin layer 4, part of the resin layer 4 which is softened for deformation can be effectively prevented from invading the space by the inorganic insulating layer 5. Accordingly, sticking of resin to the electronic elements 22 etc. can be prevented, therefore an electronic device 1 capable of suppressing deterioration of the characteristics can be provided.

The inorganic insulating layer 5 is made of for example ceramic material such as alumina, silica or the like or glass material and so on.

The method of formation of the resin layer 4 and inorganic insulating layer 5 will be explained below. First, on the resin layer 4 in a B stage state before thermosetting, the inorganic insulating layer 5 is formed by sputtering.

As this sputtering, for example, use is made of a low temperature sputtering method. According to this method, the inorganic insulating layer 5 can be formed at a low temperature without causing heat setting of the resin layer 4 targeted by the sputtering. Note that, according to the low temperature sputtering method which will be specifically shown below, the sputtering can be applied while keeping the resin layer 4 at a low temperature of about 70 to 90° C. Here, where for example an epoxy resin is used as the resin layer 4, the temperature at which the resin layer 4 commences thermosetting is for example about 110 to 130° C. Accordingly, according to the low temperature sputtering method, the inorganic insulating layer 5 can be formed without causing heat setting of the resin layer 4.

As the low temperature sputtering method, specifically, other than the method which does not perform heating at the time of sputtering, there can be mentioned a method of applying sputtering while cooling the surface of the resin layer 4 on the side where the inorganic insulating layer 5 is not formed, a method of lowering the sputter rate (film-formation speed), and other methods.

Next, the resin layer 4 and inorganic insulating layer 5 are placed on the back surface of the chip component 2 so that the inorganic insulating layer 5 side is positioned on the chip component 2 side. Next, high heat is applied to the resin layer 4 side to soften the resin layer 4. Due to this, the resin layer 4 and inorganic insulating layer 5 are deformed so as to become shapes matching the surface of the chip component 2. Then, by further continuously applying heat, the resin layer 4 is hardened. According to the above procedure, the electronic device 1 shown in FIG. 1 is obtained.

Note that, the electronic device 1 may be produced by a "many-up" technique as well. For example, first, a plurality of chip components 2 are mounted on a mother board of the wiring boards 3. Next, a plurality of assemblies of resin layers 4 and inorganic insulating layers 5 are placed on the back surfaces of the plurality of chip components 2. Then, in the same way as explained before, by heating, the assemblies are deformed so as to match the shape of the chip component 2 and are hardened. Then, the assemblies and mother board are simultaneously cut by a dicing blade or the like. Due to this, a plurality of electronic devices 1 can be simultaneously obtained.

(Second Embodiment)

Figure 3:
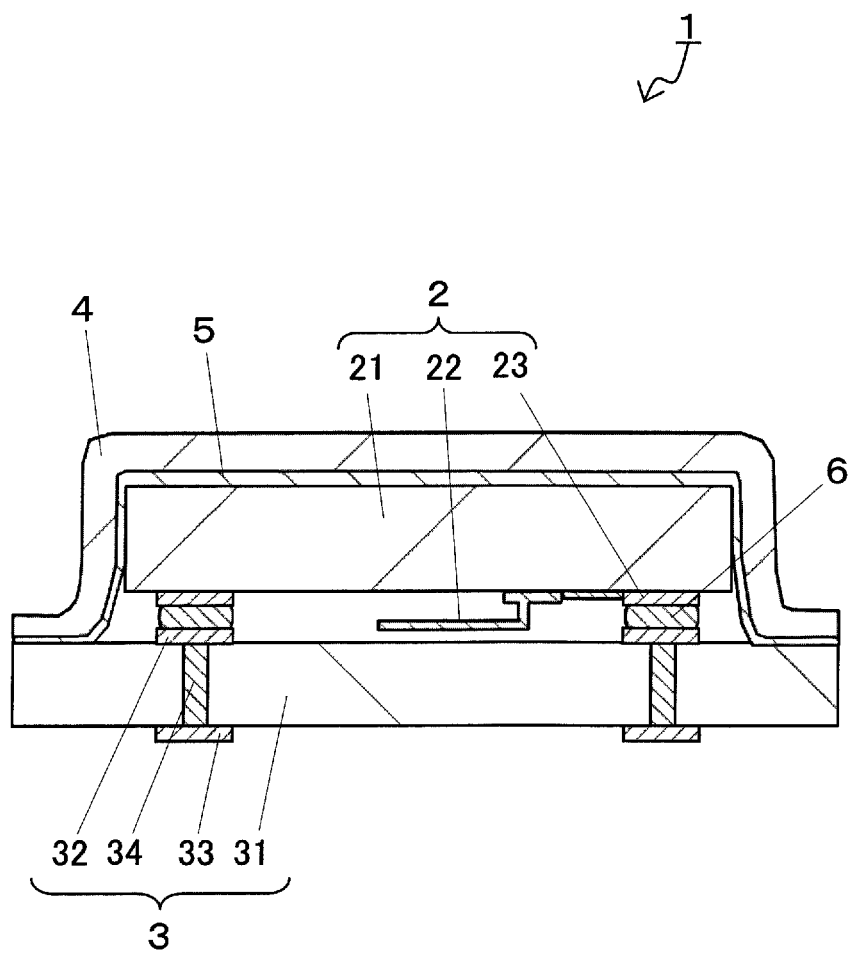
[FIG. 3] A cross-sectional view showing another example of an embodiment of the electronic device of the present invention.

In the example shown in FIG. 3, the electronic device 1 is used as a micromirror device, optical device, micropump etc.

In the example shown in FIG. 3, the chip component 2 has a semiconductor substrate 21. Further, the chip component 2, at the bottom surface of the semiconductor substrate 21, has an electronic element 22 which is a micro electromechanical mechanism 22 and pad electrodes 23. The micro electromechanical mechanism 22 is electrically connected to the pad electrodes 23.

The semiconductor substrate 21 is formed by silicon, polysilicon, or the like. Further, the bottom surface of the semiconductor substrate 21 may be formed with a recess (not shown) for containing the micro electromechanical mechanism 22 of the chip component 2 inside it. When a portion of the micro electromechanical mechanism 22 is contained in the recess, the height of the bumps 6 for forming the space for containing the micro electromechanical mechanism 22 can be kept low. This is advantageous for lowering the height of the electronic device 1. The recess is formed by using a photolithography or a so-called mask-less etching technique such as laser processing to the silicon or polysilicon, is formed by using an etching technique such as hydrofluoric acid etching or dry etching or the like.

The micro electromechanical mechanism 22 has the function of for example an electrical switch, inductor, capacitor, resonator, antenna, micro relay, optical switch, magnetic head for a hard disc, microphone, biosensor, DNA chip, micro reactor, print head, various types of sensors such as an acceleration sensor or pressure sensor, a display device, and so on. The micro electromechanical mechanism 22 is a part formed by so-called micro-machining based on semiconductor micromachining technology. Note that, one element has dimensions of about 10 micrometers to several hundred micrometers.

In the example shown in FIG. 3, the wiring board 3 has a substrate body 31, pad electrodes 32 and 33 which are provided on this substrate body, and via electrodes 34 provided in the substrate body 31. In the example shown in FIG. 3, the top surface of the wiring board 3 may also be formed with a recess (not shown) for containing the micro electromechanical mechanism 22 of the chip component 2. When containing a portion of the micro electromechanical mechanism 22 in the recess, the height of the bumps 6 for forming the space for containing the micro electromechanical mechanism 22 can be kept low. This becomes advantageous for lowering the height of the electronic device 1.

As the substrate body 31, as explained before, use may be made of a ceramic material, organic resin material, or a composite material formed by mixing an inorganic material such as a ceramic, glass, or the like with an organic resin material.

The pad electrodes 32 and 33 and via electrodes 34 are electrically connected through the bumps 6 formed on the pad electrodes 32 to the pad electrodes 23 of the chip component 2 and have the function of leading the pad electrodes 23 to the other major surface or side surface of the wiring board 3.

The pad electrodes 32 and 33 and via electrodes 34 are formed by metal material such as W, Cu, Ag, Au, Pd, Ta, Mn, or the like. As the means for formation, use can be made of a means for coating a metal by a metallized layer, plating layer, vapor deposition, or the like as the thin film layer. For example, this is formed by printing pastes of W and Ag on green sheets which become the substrate body 31 of the wiring board 2 and sintering them together with the green sheets.

The bumps 6 are formed by solder such as Sn—Ag based, Sn—Ag—Cu based, or the like, low melting point brazing material such as Au—Sn based or the like, high melting point brazing material such as Ag—Ge based or the like, a conductive organic resin, or a metal material that enables formation of a joint by welding method such as seam welding/electron beam welding or the like.

The resin layer 4 and inorganic insulating layer 5 in the electronic device 1 in the example shown in FIG. 3 are same as those in the example shown in FIG. 1.

Note that, the present invention is not limited to the examples of the embodiment explained above. Various modifications and improvements are possible within a range not out of the gist of the present invention.

Figure 4A:
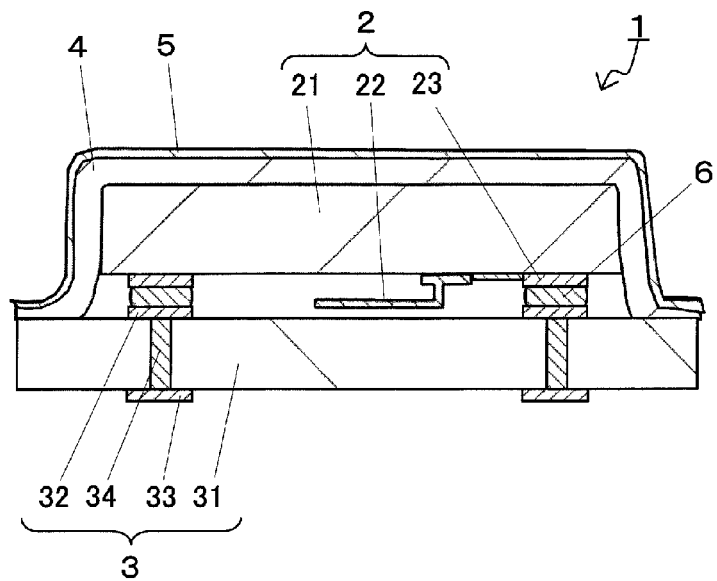
[FIG. 4] Both of A and B are cross-sectional views showing other examples of an embodiment of the electronic device of the present invention.

As in the example shown in FIG. 4A, the inorganic insulating layer 5 may be provided at the outer surface of the resin layer 4 so far as this is provided at the resin layer 4 and is positioned at the side of the space.

Figure 4B:
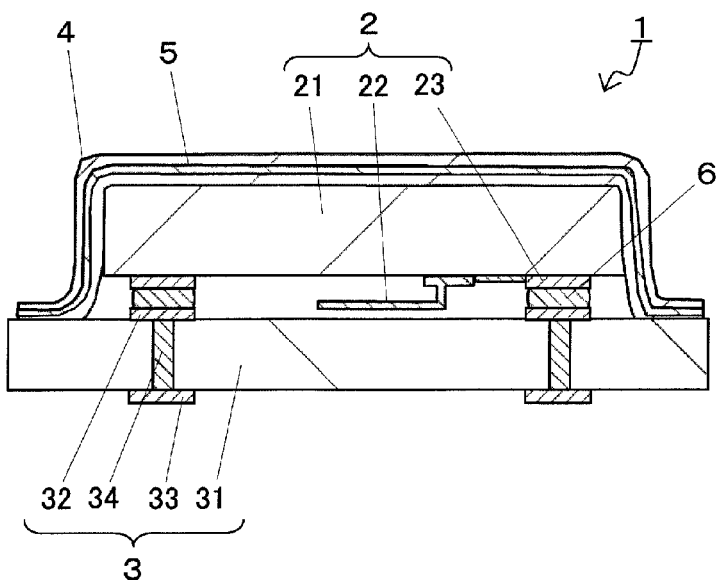

Further, as in the example shown in FIG. 4B, the inorganic insulating layer 5 may be provided inside the resin layer 4 so far as it is provided at the resin layer 4 and is positioned at the side of the space. In this case as well, in the manufacturing process, invasion of part of the resin layer 4 softened for deformation into the space can be effectively prevented by the inorganic insulating layer 5. In order to provide the inorganic insulating layer 5 in the example shown in FIG. 4B inside the resin layer 4, a method of dividing the resin layer 4 to two layers, first providing the inorganic insulating layer 5 on the inner circumferential surface of the resin layer 4 as the first layer and then providing the resin layer 4 as the second layer on this may be employed.

Note that, FIG. 4 was shown as a modification of FIG. 3, but may be a modification of FIG. 1 as well.

Figure 5A:
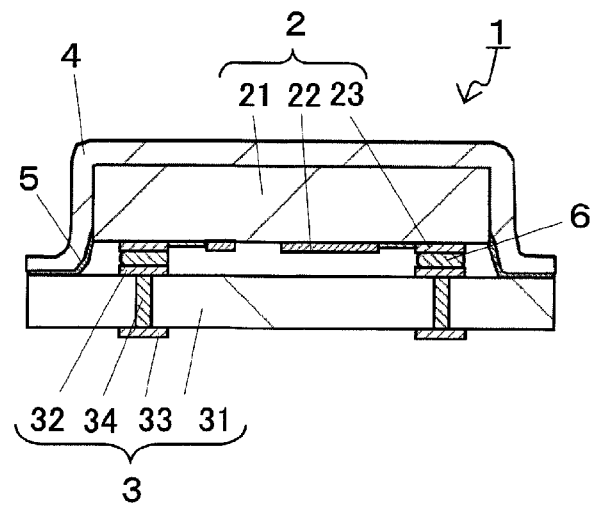
[FIGS. 5] A to C are cross-sectional views showing other examples of an embodiment of the electronic device of the present invention.
Figure 5B:
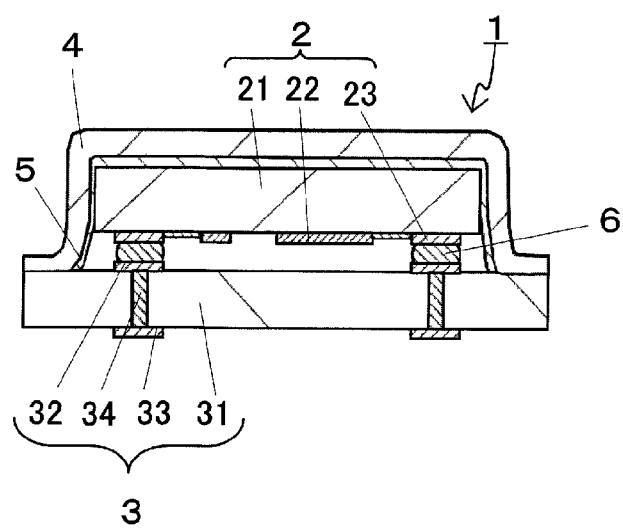
Figure 5C:
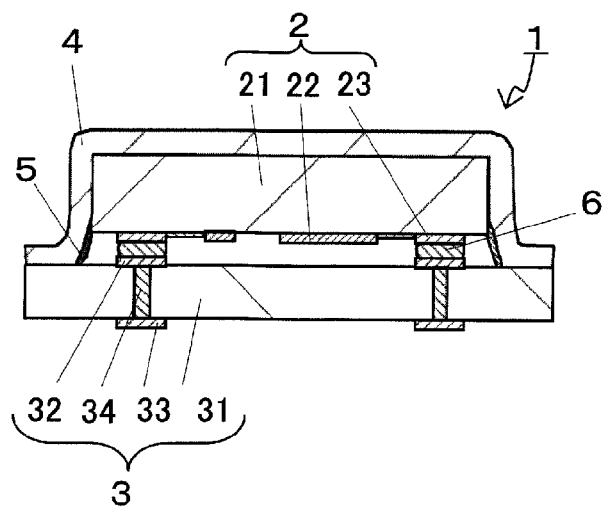

Further, as in the example shown in FIGS. 5A to 5C, the inorganic insulating layer 5 may be partially provided at the resin layer 4 so far as it annularly surrounds the space for containing the electronic element 22. When configured in this way, the amount of the inorganic insulating layer 5 to be provided at the resin layer 4 can be reduced while keeping the effect of the inorganic insulating layer 5 in the example shown in FIG. 1, therefore an electronic device 1 capable of being reduced in cost can be provided. Further, FIG. 5 were shown as modifications of FIG. 1, but may be modifications of FIG. 3 as well.

In the example shown in FIG. 5A, the inorganic insulating layer 5 is provided on the inner surface of the resin layer 4, but the inorganic insulating layer 5 is not provided on the side surfaces and top surface of the chip component 2, therefore the resin layer 4 can be directly coated on the chip component 2 and the adhesive force of the resin layer 4 to the chip component 2 can be improved. In the case of the configuration shown in FIG. 5B, the inorganic insulating layer 5 is provided on the inner surface of the resin layer 4, but the inorganic insulating layer 5 is not provided on the top surface of the wiring board 3, therefore the resin layer 4 can be directly coated on the wiring board 3 and the adhesive force of the resin layer 4 to the wiring board 3 can be improved. In the case of the configuration shown in FIG. 5C, the inorganic insulating layer 5 is provided on the inner surface of the resin layer 4, but is positioned only between the outer surface of the resin layer 4 and the space, therefore the effects of the both of FIGS. 5A and 5B can be exerted.

Further, the inorganic insulating layer 5 may be formed by a method of forming an alumina layer by sputtering aluminum on the resin layer 4 to form an aluminum layer on the resin layer 4 and ashing the formed aluminum layer by oxygen.

Further, as in the example shown in FIG. 1, when the inorganic insulating layer 5 is provided on the inner surface of the resin layer 4, if the thermal expansion coefficients of the resin layer 4, inorganic insulating layer 5, and chip component 2 are $\alpha 1$, $\alpha 2$, and $\alpha 3$, preferably the relationship of $\alpha 1 > \alpha 2 > \alpha 3$ is satisfied. In this case, even if the ambient temperature of the electronic device 1 changes, generation of stress due to the difference of thermal expansion coefficients among members can be reduced, therefore peeling between members can be suppressed. Further, the stress due to the difference of thermal expansion between the chip component 2 and the inorganic insulating layer 5 is small compared with the stress in a case where the resin layer 4 is directly coated on the chip component 2, therefore the influence of the stress applied to the chip component 2 can be suppressed.

Note that, the materials of the resin layer 4, inorganic insulating layer 5, and chip component 2 satisfying the relationship of thermal expansion coefficients as explained above are a combination of an epoxy resin (thermal expansion coefficient: about $60 \times 10^{-6}$/K), alumina (thermal expansion coefficient: about $6 \times 10^{-6}$/K), and $LiTaO_3$ (thermal expansion coefficient: about $1.6 \times 10^{-6}$/K).

Figure 6A:
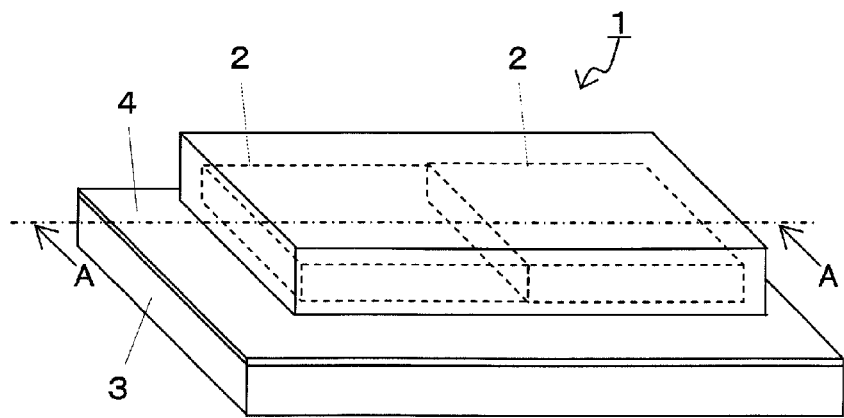
[FIG. 6] A is a perspective view showing another example of an embodiment of the electronic device of the present invention, and B is a cross-sectional view along an AA line in A.
Figure 6B:
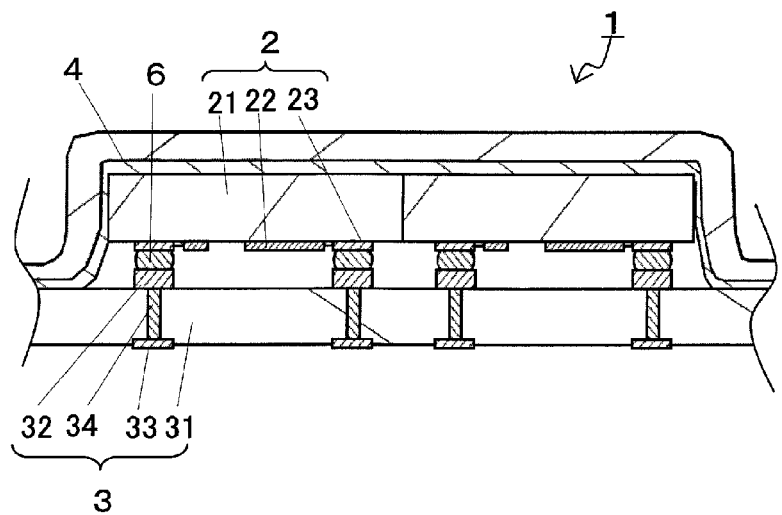

Further, as in the example shown in FIG. 6, two chip components 2 may be mounted on the wiring board 3 as well. Further, three or more chip components 2 may be mounted as well so far as they are sealed by the inorganic insulating layer 5 and resin layer 4.

Figure 7:
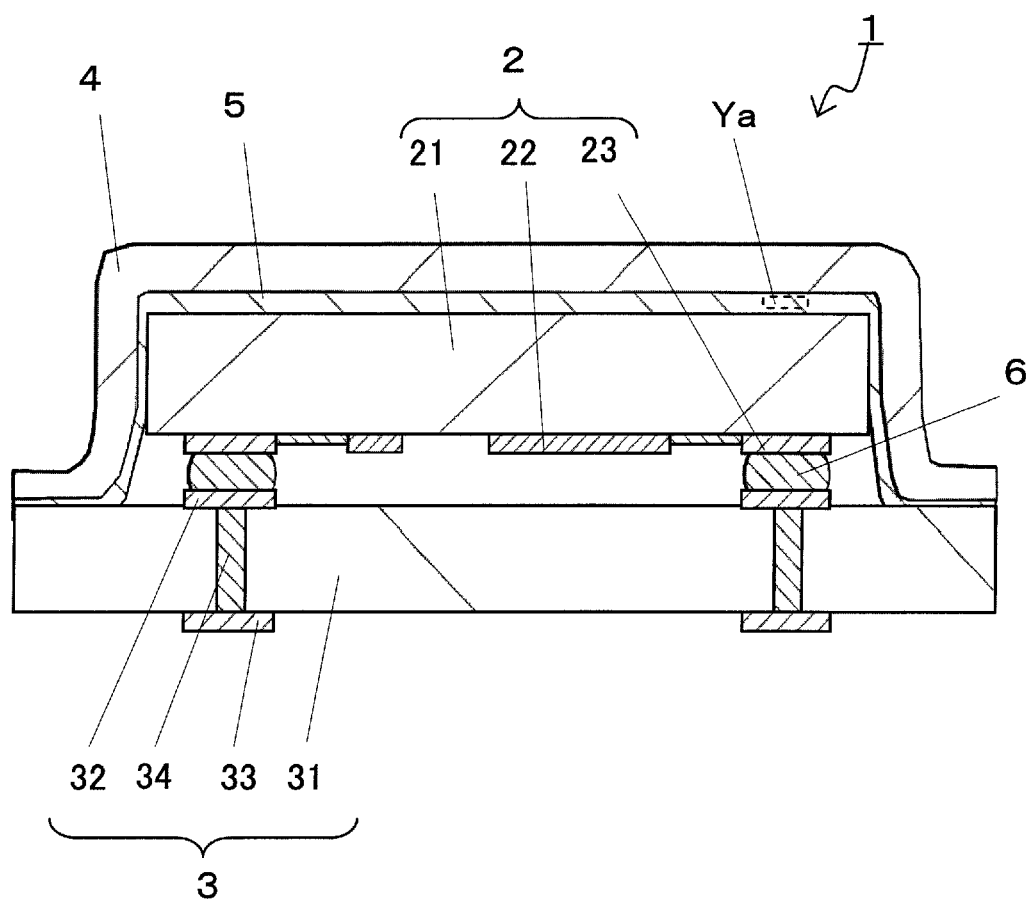
[FIG. 7] A cross-sectional view showing another example of an embodiment of the electronic device of the present invention.
Figure 8:
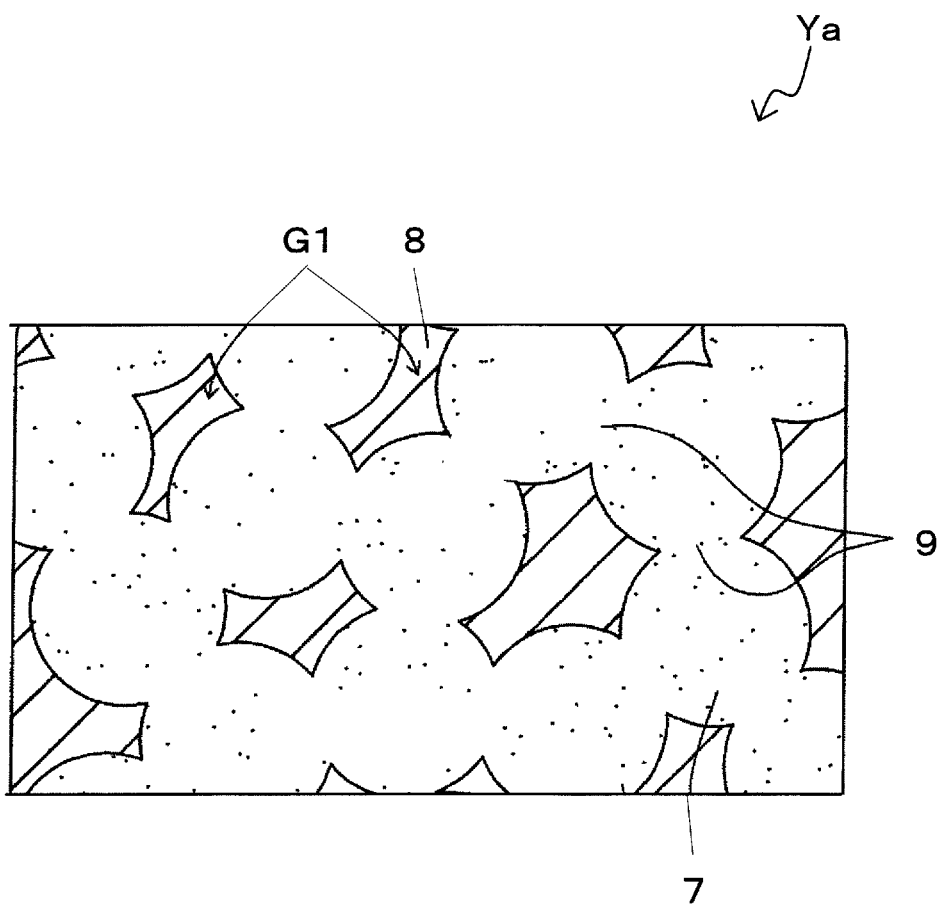
[FIG. 8] An enlarged cross-sectional view showing an example of a region Ya in FIG. 7.

Further, as shown in FIG. 7 and FIG. 8, preferably the inorganic insulating layer 5 includes a plurality of first inorganic particles 7 having a particle size not more than 130 nm and the plurality of first inorganic particles 7 are bonded to each other to form a three-dimensional matrix structure. In this case, the three-dimensional matrix structure is fine, therefore the airtight sealing performance of the electronic device 1 can be further improved, so invasion of water vapor into the space can be further suppressed.

The particle size of the first inorganic particles 7 is 130 nm or less. In this case, preferably the first inorganic particles 7 include 80 vol % or more of particles having a particle size of 110 nm or less based on the volume of the entire first inorganic particles 7. Further, more preferably, all of the first inorganic particles 7 are 110 nm or less. Note that, the lower limit value of the particle size of the first inorganic particles 7 is for example 3 nm or 30 nm.

The material of the first inorganic particles 7 is for example silica ($SiO_2$), alumina ($Al_2O_3$), titanium dioxide ($TiO_2$), or the like.

As shown in FIG. 8, the resin 8 is filled in first gaps G1 among the first inorganic particles 7. The resin 8 is for example an epoxy resin, polyimide resin, cyano resin, polyvinyl butyral resin, fluorine resin, acrylic resin, polyethylene terephthalate resin, or polypropylene resin.

For example, the inorganic insulating layer 5 includes 20 vol % to 80 vol % of the first inorganic particles 7 and includes 20 vol % to 80 vol % of the resin 8, more preferably includes 50 vol % to 80 vol % of the first inorganic particles 7 and includes 20 vol % to 50 vol % of the resin 8 (the ratio by volume of the first inorganic particles 7 is not less than the ratio by volume of the resin 8), and further preferably includes 60 vol % to 70 vol % of the first inorganic particles 7 and 30 vol % to 40 vol % of the resin 8.

As in the example shown in FIG. 8, preferably the first inorganic particles 7 are bonded to each other with first neck portions 9 therebetween. The first neck portions 9 are formed by for example diffusion of the substance. In this case, compared with a case where the first inorganic particles 7 only abut against each other, the first inorganic particles 7 are strongly bonded to each other, therefore the strength of the inorganic insulating layer 5 is improved, so this is preferred. Note, the plurality of first inorganic particles 7 are not made closer as in the sintered ceramic, and a plurality of first gaps G1 are formed among the plurality of first inorganic particles 7. That is, the plurality of first inorganic particles 7 configure the three-dimensional matrix structure in the inorganic insulating layer 5.

Figure 9A:
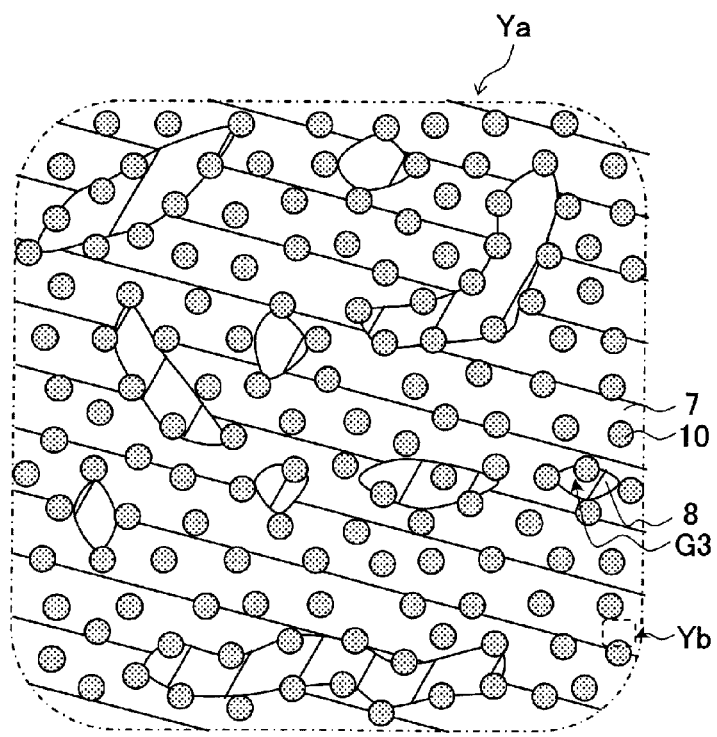
[FIG. 9] A is an enlarged cross-sectional view showing another example of the region Ya in FIG. 7, and B is an enlarged cross-sectional view showing a region Yb in A.
Figure 9B:
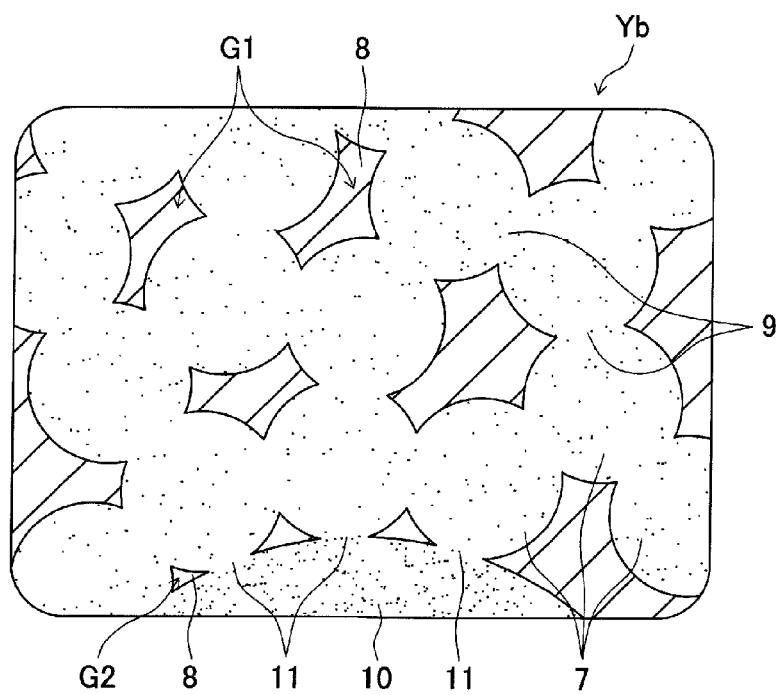

Further, as in the example shown in FIG. 9, preferably the inorganic insulating layer 5 further includes a plurality of second inorganic particles 10 having a particle size of 160 nm or more, the second inorganic particles 10 are connected to each other with the three-dimensional matrix structure among them, the three-dimensional matrix structure is formed by bonding the plurality of first inorganic particles 7 to each other. In this case, when producing the inorganic insulating layer 5 which becomes 1 μm or more, even when a slurry formed by adding a solvent to inorganic particles is coated on a carrier film and is dried, it becomes hard to rapidly dry and make the slurry shrink, therefore an inorganic insulating layer 5 having a uniform film thickness can be obtained.

The material of the second inorganic particles 10 is for example silica ($SiO_2$), alumina ($Al_2O_3$), titanium dioxide ($TiO_2$), or the like. Further, when the first inorganic particles and the second inorganic particles are formed by the same material, bonding between the first inorganic particles 7 and second inorganic particles 10 becomes strong and the strength of the inorganic insulating layer 5 is improved, so this is preferred.

The particle size of the second inorganic particles 10 is 160 nm or more. In this case, preferably, the second inorganic particles 10 include 90 vol % or more of particles having a particle size of 200 nm or more based on the volume of the entire second inorganic particles 10. Further, more preferably, all of the second inorganic particles 10 are 200 nm or more. Note that, the upper limit value of the second inorganic particles 10 is 5 μm or 600 nm.

Further, preferably, when finding the particle size distribution at a predetermined interval (for example every 10 nm) for inorganic particles included in the inorganic insulating layer 5, the difference between the particle size showing the maximum frequency of the peak on the small diameter side (first inorganic particles 7) and the particle size showing the maximum frequency of the peak on the large diameter side (second inorganic particles 10) is 100 nm or more, more preferably 200 nm or more.

Note that, the border between the particle size of the first inorganic particles 7 and the particle size of the second inorganic particles 10 is for example 150 nm.

The particle sizes of the first inorganic particles 7 and second inorganic particles 10 can be measured by for example observing the SEI (secondary electron image) and/or BEI (back scattered electron image) which is obtained by capturing a polished surface or broken surface of the inorganic insulating layer 5 by a SEM (scanning electron microscope) with a suitable magnification (for example 30000×).

The particle size is preferably calculated (measured) as the diameter of a circle having an area equivalent to the area of a particle observed in the SEI and/or BEI (circle equivalent diameter). Note, the maximum diameter may be determined as the particle size as well.

The plurality of inorganic particles configuring the inorganic insulating layer 5, for example, include, based on the total volume of the first inorganic particles 7 and second inorganic particles 10, 20 vol % to 90 vol % of first inorganic particles 7 and include 10 vol % to 80 vol % of second inorganic particles 10, more preferably include 20 vol % to 40 vol % of first inorganic particles 7 and 60 vol % to 80 vol % of second inorganic particles 10.

Note that, putting this together with the preferred volume ratio of the plurality of inorganic particles and resin 8, most preferably, the inorganic insulating layer 5 include, based on the total volume of the plurality of inorganic particles (7, 10) and resin 8, 12 vol % to 28 vol % of the first inorganic particles 7, includes 36 vol % to 56 vol % of the second inorganic particles 10, and includes 30 vol % to 40 vol % of the resin 8.

Each of the vol % of particles etc. is measured by for example using an image analyzer etc. and measuring area ratios (area percentages) of the particles occupied in the inorganic insulating layer in the SEI and/or BEI explained above at a plurality of (for example 10) cross-sections, calculating a mean value of measured values, and regarding this as the content (vol %).

Further, Each of the second inorganic particles 10 is bonded to the plurality of first inorganic particles 7 with a plurality of second neck portions 11 therebetween. In this case, compared with the case where the first inorganic particle 7 and second inorganic particle 10 only abut against each other, the two are strongly bonded, therefore the strength of the inorganic insulating layer 5 is improved, so this is preferred. Note that, the first neck portions 9 are formed by for example diffusion of the substance in the same way as the second neck portions 11. Then, the plurality of second inorganic particles 10 are connected to each other with the three-dimensional matrix structure among them, the three-dimensional matrix structure is comprised of the plurality of first inorganic particles 7. Note that, the first inorganic particles 7 and the second inorganic particles 10 are also not made closer and second gaps G2 are formed between them.

The plurality of the second inorganic particles 10 have the plurality of first inorganic particles 7 interposed between them, therefore most of them do not directly abut against each other. Further, even when the plurality of second inorganic particles 10 directly abut against each other, they are not bonded to each other (neck portions are not formed).

Both of the materials of the first neck portions 9 and the second neck portions 11 are the same material as that of the first inorganic particles 7. In this case, the same material as that of the first inorganic particles 7 means that a minute amount (0.1 wt % or less in the measurement found by EPMA analysis) of an ingredient of the second inorganic particles 10 may be included as well.

The first gaps G1 and second gaps G2 are formed by the first inorganic particles 7 not being made closer. The sizes thereof are substantially (in terms of order) the extent of the particle size of the first inorganic particles 7. The plurality of first gaps G1 are closed in the cross-sectional view, but are three-dimensionally communicated with each other. Further, the plurality of first gaps G1 are directly or indirectly communicated with the major surface of the inorganic insulating layer 5. The plurality of second gaps G2 are directly or indirectly communicated with the major surface of the inorganic insulating layer 5 as well.

In the inorganic material comprised of the plurality of first inorganic particles 7 and plurality of second inorganic particles 10, a plurality of voids G3 are formed. The inner circumferential surface of each void G3 is comprised of a plurality of the first inorganic particles 7 and a plurality of the second inorganic particles 10. The plurality of voids G3 are directly or indirectly communicated with the major surface of the inorganic insulating layer 5 as well.

Further, as in the example shown in FIG. 9, in these second gaps G2 and voids G3, the resin 8 is filled.

Next, using FIG. 10 and FIG. 11, the method of production of an electronic device 1 having the inorganic insulating layer 5 shown in FIG. 7 will be explained. Note that, in the following example, the case of the inorganic insulating layer 5 including the first inorganic particles 7 and second inorganic particles 10 will be explained. However, it may be applied to the case of the inorganic insulating layer 5 including only the first inorganic particles 7 as well.

Figure 10A:
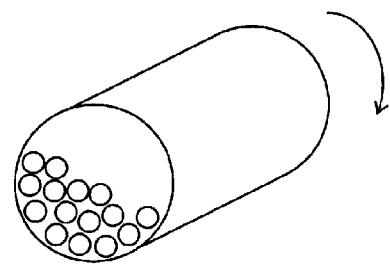
[FIGS. 10] A to C are diagrams explaining a method of production of an inorganic insulating layer in FIG. 7.

First, as shown in FIG. 10A, by using a ball mill, the first inorganic particles 7 and second inorganic particles 10 are mixed with a predetermined mixing ratio and are dispersed in a solvent to prepare a slurry. Note that, the mixing ratio (volume ratio) of the first inorganic particles 7 and second inorganic particles 10 is for example 2:8 to 4:6 as explained above.

Note that, the solvent is for example methanol, isopropanol, n-butanol, ethyleneglycol, ethyleneglycol monopropyl ether, methyl ethyl ketone, methyl isobutyl ketone, xylene, propylene glycol monomethyl ether, propyleneglycol monomethyl ether acetate, dimethylacetamide, or an organic solvent including a mixture of two or more types selected from among them.

Figure 10B:
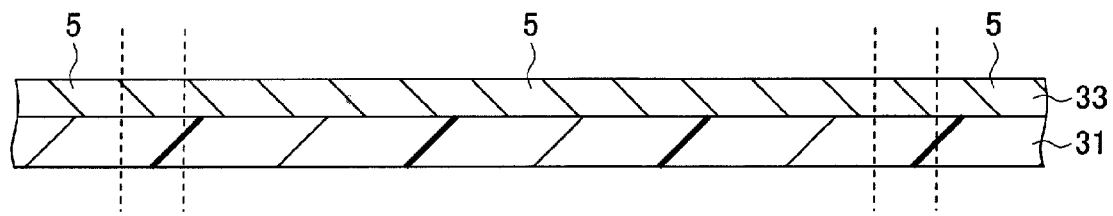

Next, as shown in FIG. 10B, by coating the prepared slurry on the carrier film 31, shaping this to a sheet, and drying it (evaporating the solvent), an inorganic insulator 33 made of an inorganic material from which a large number of inorganic insulating layers 5 (not including the resin 8 at this point of time) can be obtained is formed.

The slurry can be coated by using for example a doctor blade, dispenser, bar coater, die coater, or screen printing. The slurry is dried by for example heating or air drying. The drying temperature is set to for example 20° C. to less than the boiling point of the solvent (the boiling point of the solvent having the lowest boiling point when two or more types of solvents are mixed).

During drying, mutual bonding of first inorganic particles 7 is advanced and bonding between the first inorganic particles 7 and second inorganic particles 10 is advanced. Note, the particles are not heated to a high temperature, therefore the neck structures (first neck portions 9 and second neck portions 11) can be maintained, and the framework structure by the first inorganic particles 7 is formed (the first gaps G1 and second gaps G2 are formed).

In the first inorganic particles 7, compared with the second inorganic particles 10, the movement of atoms is active, and the two particles differ in diffusion coefficient, therefore the first inorganic particles 7 are easily bonded to each other by the neck portions. However, even when the second inorganic particles 10 abut against each other, they are hardly ever bonded to each other. Note that, such bonding preferably easily occurs in a case where the particle size of the first inorganic particles 7 is 110 nm or less, and the particle size of the second inorganic particles 10 is 200 nm or more.

Further, along with the advance of bonding of the first inorganic particles 7, the plurality of first inorganic particles 7 shrink as a whole, and thus voids G3 are formed. Note that, the formation of voids G3 can be made harder by making the vol % of the second inorganic particles 10 relatively small by for example setting the ratio of the second inorganic particles 10 to 60 vol % or less based on the total volume of the first inorganic particles 7 and second inorganic particles 10.

The carrier film 31 may be formed by a resin or other suitable material. However, from a viewpoint of the heat resistance, mechanical strength, and cost, preferably it is formed by polyethylene terephthalate (PET).

Figure 10C:
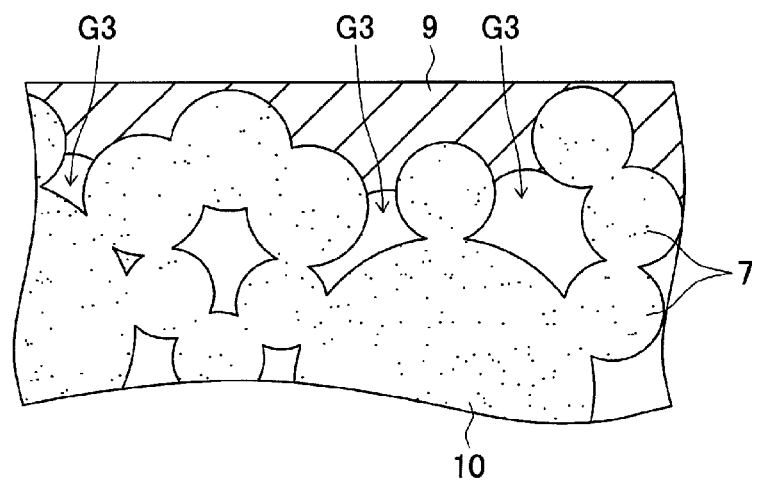

Next, as shown in FIG. 10C, the inorganic insulator 33 is impregnated with molten-state or liquid-state resin. For example, by a spin coater, the resin is coated on the major surface of the inorganic insulator 33 and the resin which is not impregnated into the inorganic insulator 33 is recovered. A required sufficient amount of resin may be supplied to the inorganic insulator 33 by screen printing or the like as well. Note that, the impregnation is carried out by capillary force. If the impregnated resin in the molten state or liquid state is hardened, the resin 8 filled in the first gaps G1, second gaps G2, and voids G3 is formed.

Figure 11A:
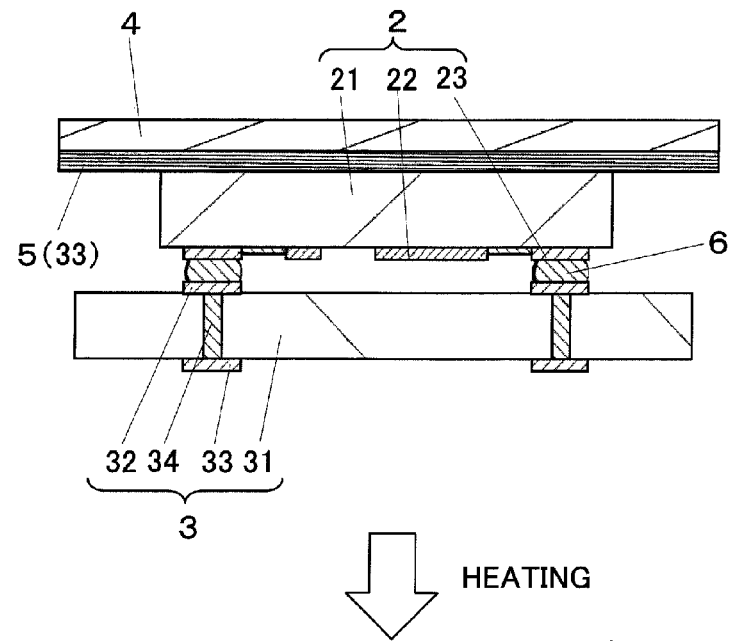
[FIGS. 11] A and B are diagrams showing a method of production of an electronic device having an inorganic insulating layer manufactured in FIG. 10.
Figure 11B:
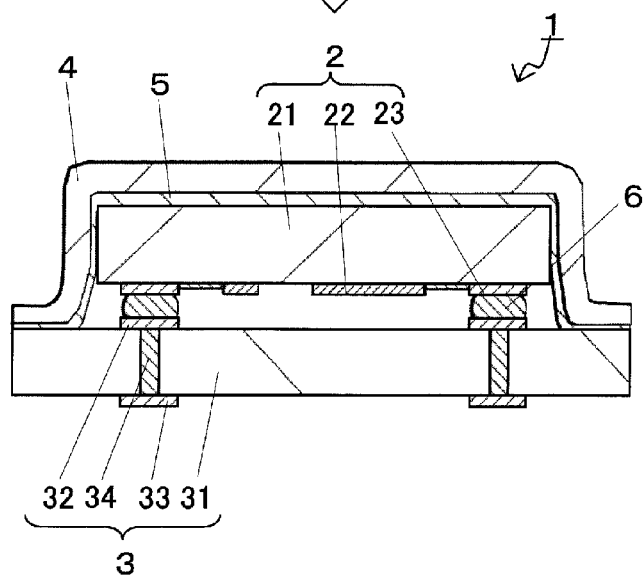

Next, as shown in FIG. 11A, the resin layer 4 and inorganic insulating layer 5 are placed on the top surface of the chip component 2. Next, by applying high heat to the resin layer 4 side, the resin layer 4 is softened. Due to this, as shown in FIG. 11B, the resin layer 4 and inorganic insulating layer 5 are deformed so as to become shapes matching the surface of the chip component 2. Then, by further continuously heating, the resin layer 4 is hardened. Further, due to this, mutual bonding of particles becomes strong. This heating temperature is preferably less than the crystallization start temperature of the inorganic material in order to suppress the growth of particles of the inorganic material and preferably not less than the boiling point of the solvent in order to evaporate the remaining solvent. For example, when the first inorganic particles 7 are formed by silica (crystallization start temperature: 1300° C.), the heating temperature is 100 to 600° C. According to the above procedure, the electronic device 1 of the example shown in FIG. 7 is obtained.

REFERENCE SIGNS LIST

1: electronic device
2: chip component
3: wiring board
4: resin layer
5: inorganic insulating layer
6: bump
7: first inorganic particle
8: resin
9: first neck portion
10: second inorganic particle
11: second neck portion

The invention claimed is:

1. An electronic device comprising:
a chip component having an electronic element;
a wiring board on which the chip component is mounted with a space therebetween, the space for containing the electronic element;
a resin layer provided from a surface of the chip component to a surface of the wiring board so as to surround the space; and
an inorganic insulating layer which is provided at the resin layer and is positioned at a side of the space, wherein the inorganic insulating layer is provided on an inner surface of the resin layer and is exposed to the space.

2. The electronic device as set forth in claim 1, wherein a relationship of $\alpha_1 > \alpha_2 > \alpha_3$ is satisfied where the thermal expansion coefficients of the resin layer, inorganic insulating layer, and chip component are $\alpha_1$, $\alpha_2$, and $\alpha_3$.

3. The electronic device as set forth in claim 1, wherein:
the inorganic insulating layer includes a plurality of first inorganic particles having a particle size not more than 130 nm, and the plurality of first inorganic particles are bonded to each other to form a three-dimensional matrix structure.

4. The electronic device as set forth in claim 3, wherein there is a resin among the first inorganic particles forming the three-dimensional matrix structure.

5. The electronic device as set forth in claim 3, wherein the first inorganic particles are bonded to each other with first neck portions therebetween.

6. The electronic device as set forth in claim 3, wherein:
the inorganic insulating layer further includes a plurality of second inorganic particles having a particle size not less than 160 nm, and
the second inorganic particles are bonded to each other with the three-dimensional matrix structure among them, the three-dimensional matrix structure formed by bonding the plurality of first inorganic particles to each other.

7. The electronic device as set forth in claim 6, wherein the first inorganic particles and second inorganic particles are made of the same material.

8. The electronic device as set forth in claim 6, wherein the first inorganic particles and second inorganic particles are bonded to each other with second neck portions therebetween.

9. An electronic device comprisinq:
a chip component having an electronic element;
a wiring board on which the chip component is mounted with a space therebetween for containing the electronic element;

a resin layer provided from a surface of the chip component to a surface of the wiring board so as to surround the space; and an inorganic insulating layer provided at the resin layer and positioned at a side of the space, wherein the inorganic insulating layer is provided inside the resin layer.

10. The electronic device as set forth in claim 9, wherein:

the inorganic insulating layer includes a plurality of first inorganic particles having a particle size not more than 130 nm, and the plurality of first inorganic particles are bonded to each other to form a three-dimensional matrix structure.

11. The electronic device as set forth in claim 10, wherein there is a resin among the first inorganic particles forming the three-dimensional matrix structure.

12. The electronic device as set forth in claim 10, wherein the first inorganic particles are bonded to each other with first neck portions therebetween.

* * * * *